United States Patent
Fortner

(10) Patent No.: US 8,675,321 B2
(45) Date of Patent: Mar. 18, 2014

(54) START TEST ELECTRONIC DEVICE AND SYSTEM AND METHOD OF USE THEREOF

(75) Inventor: Douglas Fortner, Setauket, NY (US)

(73) Assignee: Darby Group Inc., Setauket, NY (US)

( * ) Notice: Subject to any disclaimer, the term of this patent is extended or adjusted under 35 U.S.C. 154(b) by 902 days.

(21) Appl. No.: 12/769,213

(22) Filed: Apr. 28, 2010

(65) Prior Publication Data

US 2010/0271006 A1   Oct. 28, 2010

Related U.S. Application Data

(60) Provisional application No. 61/173,415, filed on Apr. 28, 2009.

(51) Int. Cl.
*H02H 7/08*   (2006.01)

(52) U.S. Cl.
USPC ............. 361/31; 361/23; 361/30; 361/628; 318/101; 318/445; 318/142; 318/49; 318/139; 322/16; 322/14; 320/127; 320/128; 320/132; 320/134; 320/136

(58) Field of Classification Search
USPC ........... 320/127, 128, 132, 134, 136; 361/31, 361/23, 30, 628; 318/101, 445, 142, 49, 62, 318/139, 140, 5; 340/636.12, 636.13; 702/62, 63, 58, 57; 322/16, 14
See application file for complete search history.

(56) References Cited

U.S. PATENT DOCUMENTS

| | | | | |
|---|---|---|---|---|
| 4,631,455 A | * | 12/1986 | Taishoff | 318/37 |
| 5,132,604 A | * | 7/1992 | Shimane et al. | 322/10 |
| 5,280,231 A | * | 1/1994 | Kato et al. | 322/28 |
| 5,412,323 A | * | 5/1995 | Kato et al. | 324/429 |
| 5,444,378 A | * | 8/1995 | Rogers | 324/428 |

(Continued)

FOREIGN PATENT DOCUMENTS

| | | |
|---|---|---|
| WO | WO 97/07518 | 2/1997 |
| WO | WO 00/33336 | 6/2000 |
| WO | WO 00/44009 | 7/2000 |

OTHER PUBLICATIONS

McMaster-Carr, Part No. 7605K42, 1 page, www.mcmaster.com, 2004 McMaster-Car Supply Company.

(Continued)

*Primary Examiner* — Rita Leykin
(74) *Attorney, Agent, or Firm* — Andrew F. Young, Esq.; Lackenbach Siegel, LLP

(57) ABSTRACT

The present invention is a method and system for monitoring the continuous flow of power delivered by multiple DC Direct current operated starter motors used to start engine driven electrical generators. The method and system comprise the closing of a starter battery system and an associated starter control switch, causing the starter battery system to discharge through a shunt whereby current is fed into a starter motor. The shunt is optionally provided as a precision resistor with a pre-calibrated voltage drop in millivolts DC proportional to a current passing through it. The shunt directs current to a meter relay, which is calibrated by establishing two set points, or desired trigger ranges, for the meter relay. If the current falls outside a range established by the two set points, then a meter relay alarm output is activated; and, if the current remains within the range, then the meter relay alarm output is not activated. The meter relay alarm output is, optionally, a dry contact which activates a signal device.

30 Claims, 5 Drawing Sheets

(56) References Cited

U.S. PATENT DOCUMENTS

| | | | |
|---|---|---|---|
| 5,986,876 | A | 11/1999 | Stepanov et al. |
| 6,181,546 | B1 | 1/2001 | Stepanov et al. |
| 6,222,723 | B1 | 4/2001 | Razoumov et al. |
| 6,545,445 | B1 * | 4/2003 | McDermott et al. .......... 320/103 |
| 6,885,167 | B2 * | 4/2005 | Palanisamy et al. .......... 320/104 |

OTHER PUBLICATIONS

KBI® KAPower, Installation—Operation Manual, Revision of Aug. 2007, KBi/Kold-Ban International, Ltd., 17 pages.

Fairchild Semiconductor Corporation, 2006, www.fairchildsemi.com, LM78XX/LM78XXA, 3-Terminal 1A Positive Voltage Regulator, technical disclosure, pp. 1-28.

PCB Relay G2RL, A Power Relay with Various Models, 8 pages, Omron Electronic Components, LLC, Jun. 2009, technical disclosure.

Fairchild Semiconductor Corporation, 2002, LM555/NE555/SA555, Single Timer, pp. 1-14, technical disclosure.

Phoenix Contact, PT 1,5/12-PVH-3,5—Extract from online catalog, www.phoenix.com, Apr. 13, 2010, pp. 1-5.

Phoenix Contact, PT 1,0/12-3,5—Extract from online catalog, www.phoenix.com, Apr. 13, 2010, pp. 1-4.

National Semiconductor, Feb. 2003, LM3914 Dot/Bar Display Driver, www.national.com, pp. 1-22, technical disclosure.

* cited by examiner

START TEST ELECTRONIC DEVICE AND SYSTEM AND METHOD OF USE THEREOF

CROSS REFERENCE TO RELATED APPLICATIONS

This application claims priority from U.S. Provisional Patent Application Ser. No. 61/173,415, filed Apr. 28, 2009, the entire contents of which is herein incorporated fully by reference.

FIGURE FOR PUBLICATION

To be selected.

BACKGROUND OF THE INVENTION

1. Field of the Invention

The present invention relates to a system for monitoring and testing the secure operation of power generators and related power supply systems. More specifically, the present invention relates to a system for ensuring the continuous flow of power delivered to multiple direct current (DC) operated starter motors where these are used to start a prime mover of an electrical generator such as a reciprocating engine or a turbine engine and to minimize starter motor failure or non-scheduled down-time.

2. Description of the Related Art

Industry and commerce has been, and continues to be, powered by a growing supply of large engine-driven electrical generators which are primarily used to drive (supply power to) large data centers and industrial and medical complexes, among other applications. These large scale generators are typically supplied with two electric starter motors to start the associated engine. These motors are typically 24 volt DC and each have a separate battery source.

In a very large-tier data center (for example—a Tier 3 or Tier 4 data center), with turn-key costs of approximately one hundred million dollars ($100,000,000), with standby power being as much as 25% of the investment, the back-up power generators are massive and must have a very low failure rate. These engines often operate at approximately 4000 HP, driving 3.5 Megawatt, 1800 RPM electrical generator rated at 5 or 15 KVAC. Conventionally, each of these large power sources is started with two starter motors in parallel (each producing its share of starting torque and HP to crank the engine in a shared mode at the same time). Effective starting of the starter motors is crucial, as it results in ultimate operation of the back-up power generator. Failure of the starter motors has a cascading affect on the system, thus causing failure. Unfortunately, in current systems, the parallel installation of the starter motors does not provide notice if the first starter motor fails to operate. If the first motor does fail to operate, then the second starter motor will bear the strain of a dual load, leading to its unpredictable and eventual failure at an accelerated pace.

In normal operation, the starting power of the system is on the order of 1000-1300 Amps which is split between the two starter motors. If the first motor fails, then the second motor draws the entire amperage load. Currently available monitoring systems do not exist, or are not adequate in their profile building, so there is little or no means of predicting failure in the second starter motor.

As a result of system failure involving second starter motors, it is often determined in post-operative analysis that both motors had failed: the first through various defects or anomalies; and, the second through overload of the starter relays, or through failure of a starter solenoid, winding failures, bearing failures or several other failure modes. Many of these failure modes are accelerated by severe stress from having to bear the full amperage load together with a failure in preventative or predictive maintenance.

What is not appreciated by the prior art is that there is a need in the market to address the issue of back-up starter motor failure and to incorporate the same into a preventive maintenance cycle so as to protect the high-draw devices and systems being driven by electrical input.

Accordingly, there is a need for an improved method, system, and apparatus for monitoring and testing multiple DC electrically operated starter motors to start an engine.

Additionally, there is needed a method and system that will give a warning to a system operator of a failure of either starter motor in a power generating system.

ASPECTS AND SUMMARY OF THE INVENTION

An aspect of the present invention is to provide a method and system for monitoring and testing multiple electrically operated starter motors which are used to start an engine driven electric power generator Another aspect of the present invention is to provide a method and system that will give a warning to a system operator of a failure of either starter motor in a power generating system and the ability to effectively predict the same.

The present invention relates to a method and system for monitoring the continuous flow of power delivered by multiple starter motors used to start and engine driven electric generator. The method and system comprise the closing of a starter battery system and an associated starter control switch, causing the starter battery system to discharge through a shunt whereby current is fed into a starter motor. The shunt is a precision resistor with a pre-calibrated voltage drop in millivolts DC proportional to a current passing through it. The shunt directs current to a meter relay, which is calibrated by establishing two set points for the meter relay. If the current falls outside a range established by the two set points, then a meter relay alarm output is activated; and, if the current remains within the range, then the meter relay alarm output is not activated. The meter relay alarm output is a dry contact which activates a signal device together with a visual indication at the meter.

According to an embodiment of the present invention there is provided a method and system for monitoring the continuous flow of power delivered by multiple DC starter motors on the engine driven electric generator. An initial step of the method and system comprises the closing of a starter battery system and an associated starter control switch, causing the starter battery system to discharge through a shunt whereby current is fed into a starter motor. Subsequent steps comprise calibrating a meter relay, then establishing two set points for the meter relay. If the current falls outside a range established by the two set points (on either side of the established range), then a meter relay alarm output is activated; and, if the current remains within the range, then the meter relay alarm output is not activated.

The shunt is (not restricted thereto, optionally, a Hall Effect device) a precision resistor with a pre-calibrated voltage drop in millivolts DC proportional to a current passing through it; and, is rated up to, and including for example, 2000 amperes DC at 100 millivolts. If 1000 amperes DC were passing through the shunt, the shunt would cause a voltage drop across the shunt of approximately 50 millivolts. Thus, the voltage drop across the shunt, relative to amperes DC passing through the shunt, establishes a proportion, wherein the proportion is maintained for any amperage at 2000 amperes DC or below.

The method and system's meter relay alarm output is both a local meter visual indicator and a dry contact which activates a signal device such is a bell or one or more lights. Additionally, the signal device could be a digital signal in a communication protocol for interfacing with a monitoring system; or, could be an Ethernet connection for transmitting the signal via a wireless communication system.

According to an alternative embodiment of the present invention, there is provided a method and system for monitoring the continuous flow of power delivered by multiple starter power generators. An initial step of the method and system comprises the closing of a starter battery system and an associated starter control switch, causing the starter battery system to discharge through a shunt whereby current is fed into a starter motor. Subsequent steps comprise directing DC current flow through a Hall Effect Device having a wire cable throughput and inducing a current signal from the wire cable throughput, wherein the current signal can be read by a control and alarm circuit further comprising the meter relay.

The control and alarm circuit is capable of establishing a hysteresis upon the starting of an engine wherein the circuit will ignore for a period of time (usually in milliseconds) a high current surge as the starter motor beings to turn. The control and alarm circuit will self-calibrate by taking a steady state current, as the starter motor is turning over the engine, and establishing the steady state current as a baseline current; and, then utilizing the set points to establish the range to be applied to the baseline current.

If the current falls outside the range established by the two set points, then the meter relay alarm output is activated; and, if the current remains within the range, then the meter relay alarm output is not activated.

The Hall Effect device has a pre-calibrated output signal in proportion to a current passing through it; and, is rated up to, and including, 2000 amperes DC. If 1000 amperes DC were passing through the device, the device would cause the output signal to be proportional to 1000 amperes. Thus, the output signal, relative to amperes DC passing through the device, establishes a proportion, wherein the proportion is maintained for any amperage at 2000 amperes DC or below.

The method and system's meter relay alarm output is a dry contact which activates a signal device such is a bell or one or more lights. Additionally, the signal device could be a digital signal in a communication protocol for interfacing with a monitoring system; or, could be an Ethernet connection for transmitting the signal via a wireless communication system.

In a further embodiment of the present invention, a circuit module can be interoperably connected to the starter motor for applying a test voltage for determining the possibility of the starter motor's failure due to deterioration of the electrical insulation of the starter motor's windings. The circuit module further comprises application means for applying a DC test voltage within the range of 50-500 VDC to the starter motor windings. Additionally, the circuit provides measuring means for measuring the ohmic resistance of the starter motor windings to determine a measured value; the measured values are compared with a pre-established profile value of the starter motor to determine a compared value. If the measured value is proximate to the profile value, then failure of the starter motor due to insulation failure is not imminent; however, if the measured value is low relative to the profile value, then the circuit will determine that failure of the starter motor due to the deterioration of the insulation is imminent.

The above, and other objects, features and advantages of the present invention, will become apparent from the following description read in conjunction with the accompanying drawings, in which like reference numerals designate the same elements.

DETAILED DESCRIPTION OF THE PREFERRED EMBODIMENTS

Figure 1:
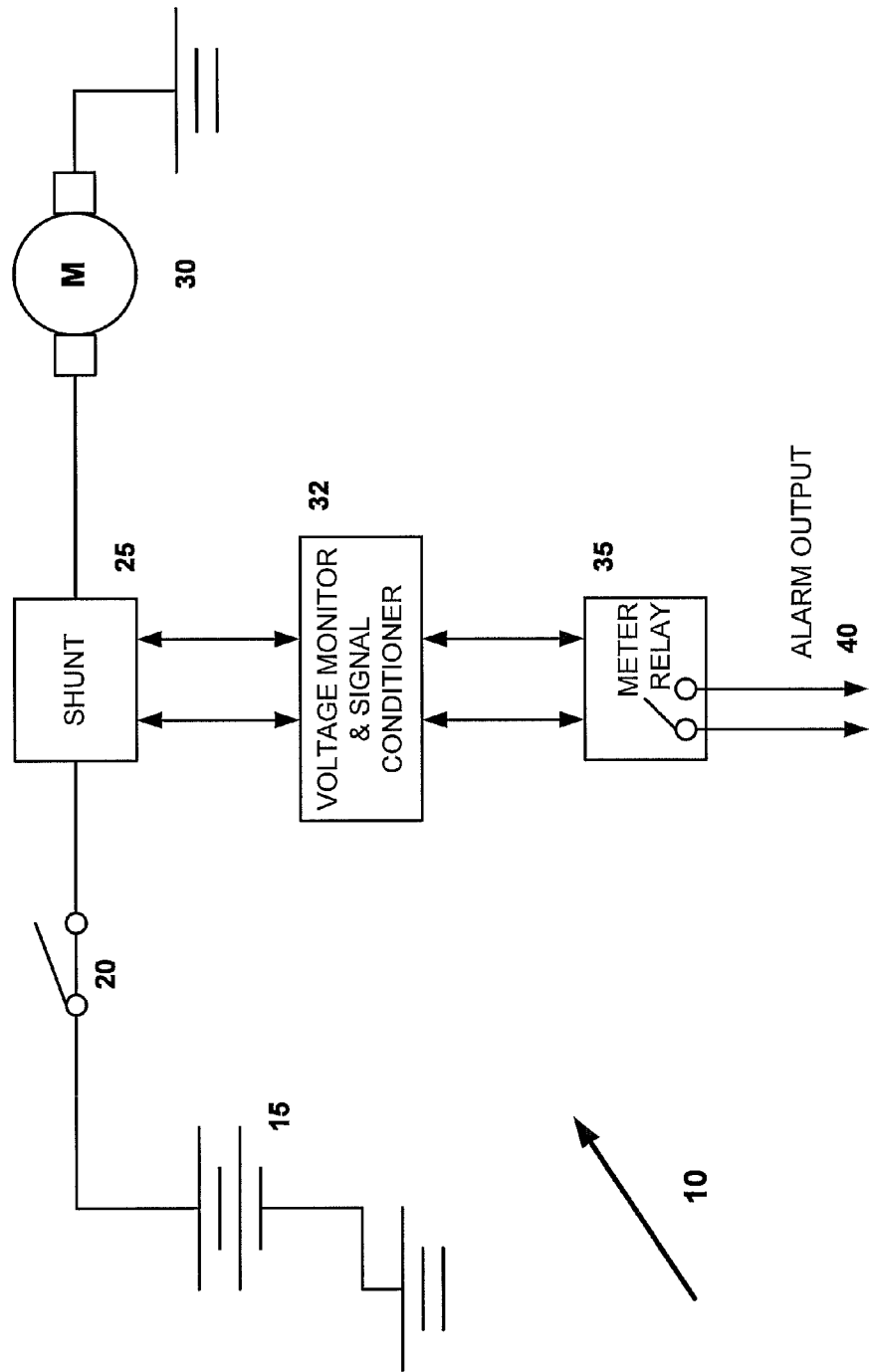
FIG. 1 is a circuit diagram utilizing a conventional shunt and meter relay within the system of the present invention.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Turning then to FIG. 1, there is shown a circuit diagram 10 utilizing a conventional shunt and meter relay within the system of the present invention.

The starting battery system and associated starter switch 15 are allowed to close at point 20, and the battery to discharge through shunt 25 feeding current into starter motor 30.

The shunt 25 is a precision resistor with a pre-calibrated precision voltage drop in millivolts DC proportional to the current passed through it—i.e. for example, the shunt is rated for 2000 amperes DC at 100 millivolts, so at 1000 A passing through the voltage drop across the shunt will be 50 millivolts, at 500 A passing through the shunt it will be 25 millivolts, and so on. It shall be noted that for the purposes of this disclosure the disclosure is not limited to the particular ratings, amperes, voltages etc. which are employed as examples only. Nothing herein shall be seen to limit the proposed system, method, and apparatus to a specific electronic or electrical rating.

The meter relay 35 (such as can be commercially obtained from Fairchild Semiconductor Corporation of South Portland, Me.) is calibrated wherein full scale is shown as, for example, 2000 amperes DC on the meter when it is reading 100 millivolts from the shunt 25. The meter relay 35 has two sets points or trigger-type thresholds (one high and one low—not shown) which can be set above and below some nominal normal value of current as will be determined by a desire of system operators and system engineers. If the current read on the meter relay 35 is "normal" or within a range of normal (i.e., for example +/−10% or another percentage determined as 'normal'), then the meter alarm set points do not operate or trigger. The signal conditioner 32 has a built-in "hysteresis" system so that the meter relay 35 ignores as a valid reading the first few milliseconds (a user-determined/user-desired time value) of high current surge before the starter motor 30 begins to turn—this prevents false alarms at initial start.

If the current goes above the preset limit/threshold, or below the preset limit/threshold (or any other type of control parameter that may be employed in combination, such as duration (time function) above a preset-limit), the meter relay 35 alarm will actuate giving alarm output 40. The alarm output 40 can be a dry contact which can be of a conventional operation or other system; for example causing the ringing of a bell, operation of warning lights, trigger to a user's control panel, a PID-type (proportional-integral-derivative-type) monitor or controller, or it can be digital signal in a communication protocol such as Modbus™ (a serial communications protocol published by Modicon for use with programmable logic controllers (PLCs)) to interface with a building monitor system. It can even be an Ethernet-type or Bluetooth-type connection (via one or more Hubs or over the Internet (as opposed to a cellular based system)) wherein the alarm output 40 can be received and read via wireless internet connection, PDA, cellular device, phone or other electronic monitoring device. It shall be understood that such a signal (notice of an above/or lower than normal set point current) may in turn trigger other actions such as an automatic scheduling of a maintenance action, ordering of a replacement part, sending of an email or facsimile, a call with an auto-recorded message, etc.

It should be noted, in general, that the sensing of a lower than normal current could indicate that the starter, or its associated starter relay, are malfunctioning, have gone bad in some way, or, that there is some high resistance in the connections which is limiting proper flow of current to the starter which would not allow it to develop the necessary horsepower (HP) and torque to perform its intended function. (NOTE. Consider the formula wherein electrical power in watts equals volts times amperes (P=IV); this can equate directly to HP, as 746 watts equals 1 HP.)

The sensing of a higher than normal current could indicate a short circuit in the starter motor, or its associated starter relay, that allows current to flow to ground through a low resistance path, while not creating mechanical HP and torque in the starter. The higher than normal current could also be an indication of a short to ground in the cabling or connections from the battery power source to the starter motor and its associated starter relay, which would have a similar debilitating effect on the starter motor performance.

In addition, and as previously mentioned, excessive high current indications could indicate that a single starter is doing the work of two (or more) starters while its companion(s) has/have ceased to function altogether. The remaining starter pulls an extra-heavy current load to produce enough HP and torque to crank the engine, but it does so in an overloaded condition (internal overheating, reduced insulation life, etc.) which will eventually result in premature failure of the starter motor.

It will be recognized by those of skill in the related arts that the above-discussion of sensing higher/lower than normal current flows and results may be equally applied to the related embodiment discussed below, and the same should be additionally incorporated following the discussion.

Figure 2:
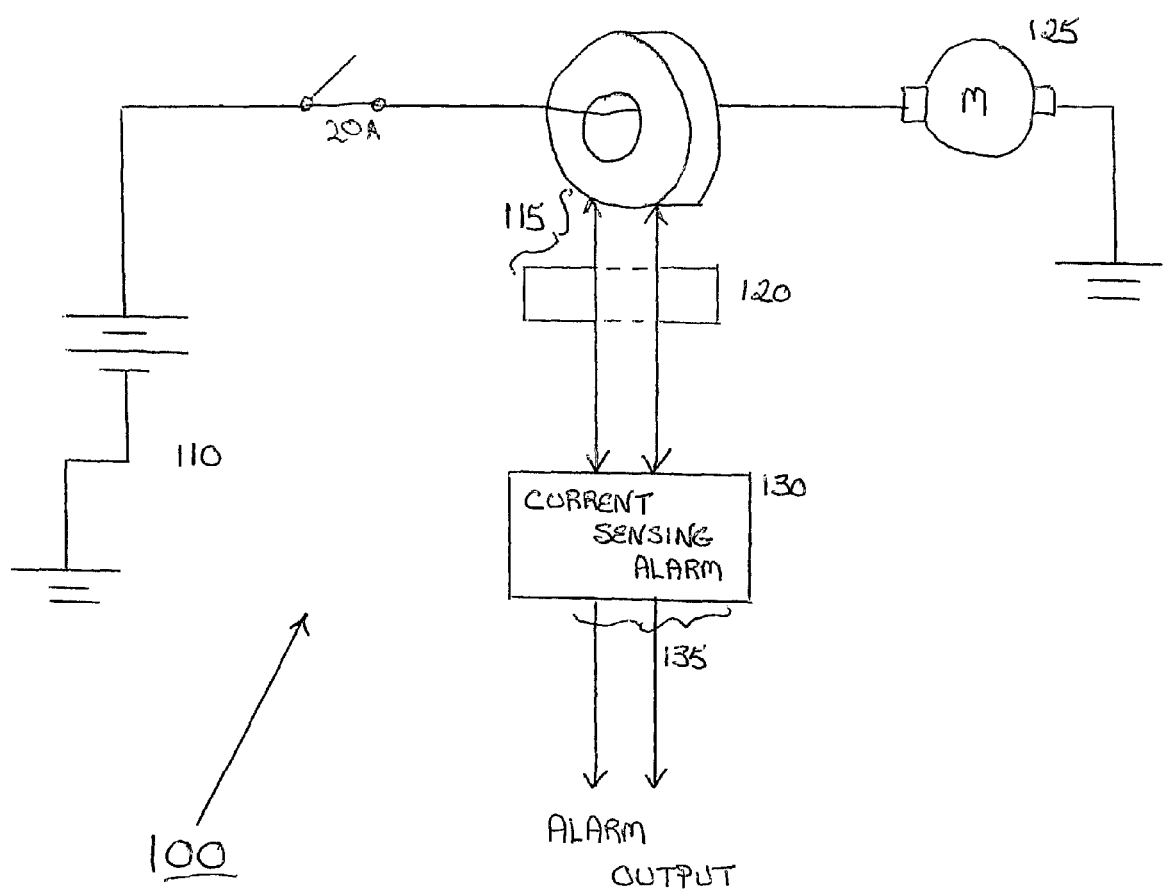
FIG. 2 is a circuit diagram utilizing a Hall Effect Device providing an induced output signal proportional to the DC direct current passing through the monitored cable with a self calibrating current sensing alarm circuit (instead of a meter relay) within the system of the present invention.

Turning next to FIG. 2, there is shown a circuit diagram 100 utilizing a Hall Effect device 115 instead of a shunt to provide a measurable signal output proportional to the DC direct current flow in the starter motor electrical feeder cable passing through the Hall effect device. This signal is be interpreted by a self calibrating current alarm electronic circuit instead of a meter relay. Such a circuit includes, but is not limited to, a built-in "hysteresis" control system to ignore (or allow without alarm) a high initial inrush current. The system self-establishes to a normal average current when each starter motor is good and functioning normally, or upon operator designated re-set or designation of a new functional norm. The circuit contains alarm thresholds preset in the circuitry at some reasonable percentage above and below the normal current such as +/−10%. As an alternative the circuit may include a programming management function to allow an authorized user to input or change the alarm threshold presets. In this manner, during operation, if the current flow exceeds these limits it would be indicative of a starter motor problem. A high current could indicate the other starter had failed. Or it could indicate this starter motor has an internal short circuit. A low current could indicate this starter had some inordinate high resistance and was not allowed to draw sufficient current to produce its required share of torque and shaft horsepower. In either circumstance, an alarm would be triggered requiring a maintenance and operational assessment.

The starting battery system and associated starter control switch 110 are allowed to close at point 20A and the battery to discharge through Hall effect Device 115 feeding current into starter motor 125.

The Hall Effect device 115 is a precision electronic device which can have a wire cable put through it. The Hall effect itself is the production of a potential difference across an electrical conductor, positioned transverse to an electric current in the conductor and a magnetic field perpendicular to the current. As discussed herein, the DC current flow into the starter motor 125 through that cable will induce a solid state device to produce a current signal 120 from the Hall Effect device that can be read and interpreted by a control and alarm circuit 130 that puts out an alarm signal 135. It will be recognized by those of skill in the art, following study of the present disclosure, that similar results, signals, analysis, triggers, etc. to those discussed in relation to embodiment 1 (see FIG. 1), may also be pursued.

The electronic sensing and alarm circuit, broadly depicted at 135, can take in the signal from the Hall effect device 115. On initial starting of the engine (not shown) the electronic sensing and alarm circuit 130 will have a hysteresis so that it ignores the high current surge for the first few milliseconds (or programmably longer or shorter) as starter motor 125 starts to turn. It then can be designed to "self calibrate" (for example during a first-installation use or during a self-calibration cycle) where it monitors and recognizes (takes) the steady state current, as the starter motor 125 is cranking the engine, as the "normal" current and sets that as its reference (allowing a designation of high/low current limits in relation thereto). As currently discussed, but not limited thereto, the electronic sensing and alarm circuit 130 has a preset adjustable set of high and low limits for alarm signals which would nominally be preset (+/−10%) around the "self calibrated" initializing normal level.

If the current goes above the preset limit, or below the preset limit, the meter relay alarm will actuate giving alarm output 135. The alarm output 135 can be a dry contact which rings a bell or lights a light on the users control panel or it can be a digital signal in a communication protocol such as Modbus™ to interface with a building monitor system. It can even be an Ethernet connection wherein the alarm output can be read via wireless internet connection, PDA, cellular device, phone or other electronic monitoring device.

Those of skill in the art, having studied the current disclosure, will recognize that the "self calibrate" cycle or process noted above can be pre-programmed into a computerized memory unit (not shown) in operative connection with circuit 130 so as to store in an electronic memory (RAM/ROM/other) and an operative control system in an initial start up or designated baseline current flow. This unit is not shown, but will be understood to include current sensing alarm 130 and related matters including (optionally) the Hall effect system 115. The circuit 130 may thereafter include programming allowing designation or acceptance of the baseline current flow as an operative norm (e.g., changing one or more data points in the electronic memory) and may thereafter set or designate upper and lower warning or alarm levels in relation thereto—and similarly save these in the electronic memory by updating the same.

Figure 3A:
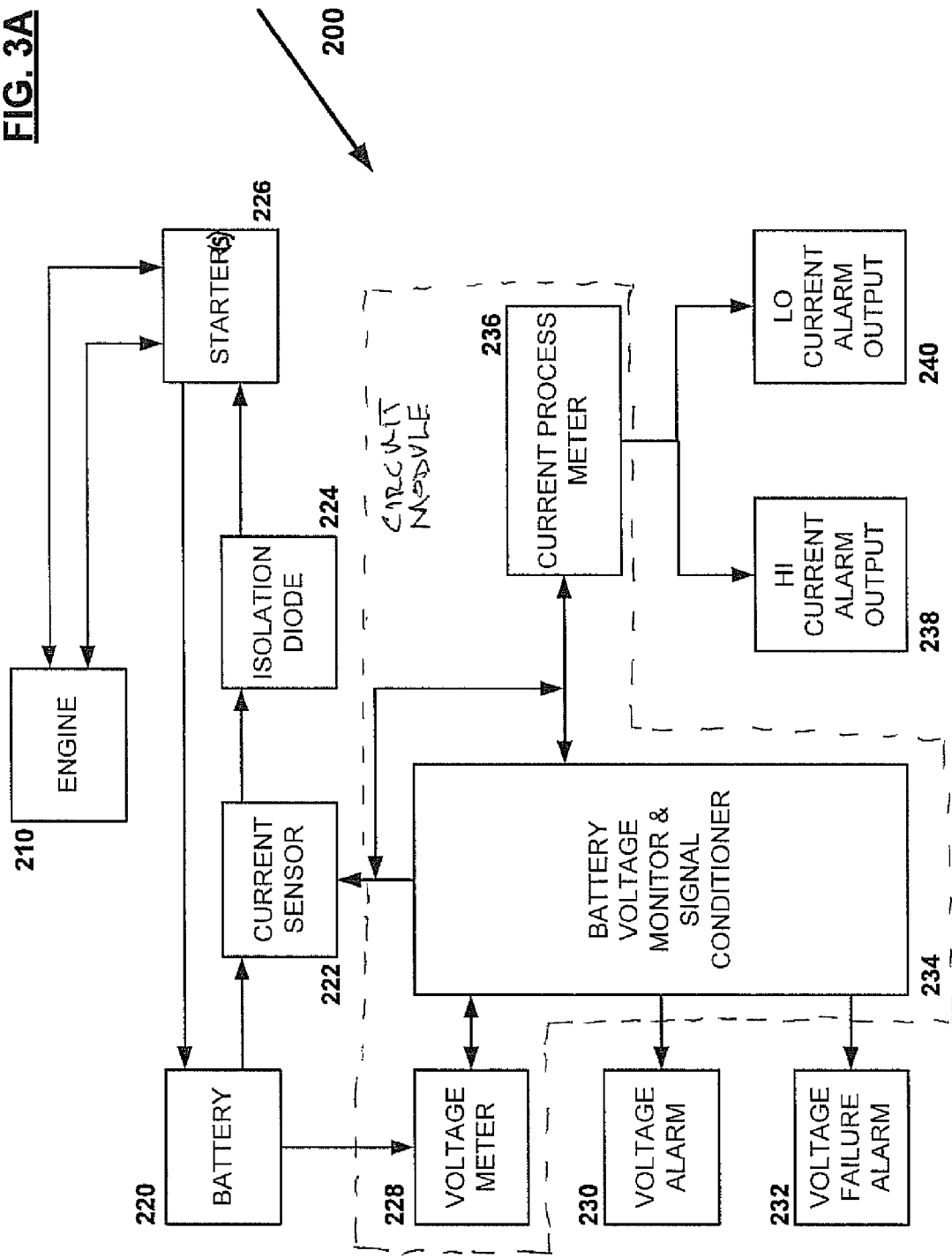
FIG. 3A is a block diagram of the system of the present invention utilizing a battery as the power source.

Turning then to FIG. 3A, there is shown a block diagram of the system 200 of the present invention utilizing a battery 220 as the power source. The system 200, defined herein, resides in an enclosure of a type that is available from McMaster-Carr Supply Company of Elmhurst, Ill.).

In a single starter system, a suitably rated diode 224, capable of carrying the required cranking current amperage with a minimum voltage drop, is connected in series to the starter 226. The diode 224 will electrically isolate each starter battery 220 and its associated battery charger. The diode 224 value is such that if one of the batteries 220 develops an internal fault, the other battery 220 will not be drained while trying to start the engine 210. Use of such diode isolators 224, generally referred to in the industry as "best battery selectors", are known for use in dual battery systems. Additionally, diode isolators 224, with associated heat sinks (such as the power semiconductor heat sinks commercially available from Wakefield Thermal Solutions, Inc. of Pelham, N.H.), can be easily incorporated into the present system 200.

The battery 220 voltage is run through voltage meter 228 to measure the voltage across the circuit. In turn, a battery voltage monitor and signal conditioner 234 interfaces with the voltage meter 228 (exemplary meters are commercially available from Newport Electronics, Inc. of Santa Ana, Calif.).

For the basic system to work, it is necessary to incorporate a current sensing time delay and signal conditioning circuit as an interface between the current sensor (shunt or Hall Effect device) and the starter current meter relay which will detect an over or under current condition. This is needed to buffer the input to the meter relay from high initial starter amperage inrush current which would provide a "false" alarm output.

This circuit can be combined with a starter 226 battery 220 charging and battery dip voltage "sample and hold" monitoring device. The voltage monitoring of charging voltage, with a digital display and alarm 230 can be used to assure that the battery 220 is getting proper "float" charging voltage applied. This is necessary to assure that the battery 220 will be in a state of full charge when called upon.

The second voltage monitor circuit looks at the voltage low point to which the battery 220 dips when the engine 210 is cranked. There are industry accepted criteria (e.g., SAE, EGSA) that have established at what level this voltage dip point indicates an "unhealthy battery." This added circuit will alarm under an excessive sensed DC voltage dip on a given cranking engine 210 start cycle. It can be pre-set to alarm at a threshold which is still high enough to allow adequate starting but indicate battery is becoming marginal. So it can function for facilities people as a "feed forward" predictive maintenance diagnostic tool. Before they have a problem, they can check the batteries, which in the case of normal lead acid truck batteries used in many of these applications, are prone to "sudden death" failure modes.

The battery voltage monitor and signal conditioner 234 outputs a voltage alarm 230 in the event that the circuit voltage drops outside acceptable parameters, and outputs a voltage failure alarm 232 in the event that voltage fails.

The battery voltage monitor and signal conditioner 234 interfaces with a current sensor 222 which in turn is in the current stream coming off the battery 220. The current sensor 222 allows the current to continue to the isolation diode 224 before the current is utilized by the starter 226.

Further, in a reciprocal relationship with the battery voltage monitor and signal conditioner 234 is a current process meter 236. The current process meter 236 evaluates the current passing therethrough and activates a high current alarm output 238 if the current is above the applicable set point, or activates a low current alarm output 240 if the current is below the applicable set point.

In a further embodiment of the present invention, a circuit module (not shown) can be interoperably connected to the starter motor 226 for applying a test voltage for determining the possibility of the starter motor 226 failure due to deterioration of the electrical insulation of the starter motor 226 windings. Such circuits are commercially known; a representative module embodying such a circuit is commercially available from Automeg, Inc. of Astatula, Fla. and is available as a 12 pin plug-in module in various configurations. The circuit diagram and module design are disclosed on the Automeg website (www.automeg.com) and are incorporated herein in their entirety.

The circuit module further comprises application means for applying a DC test voltage within the range of 50-500 VDC to the starter motor windings. Typically, a new motor will meet very high resistance of the windings to ground (generally in the range of 100 meg ohms). If the measured ohmic resistance is down in the range of 1 meg ohm, or less, then the motor may be on the verge of failure. Additionally, the circuit provides measuring means for measuring the ohmic resistance of the starter motor 226 windings to determine a measured value; the measured values are compared with a pre-established profile value of the starter motor to determine a compared value. If the measured value is proximate to the profile value, then failure of the starter motor due to insulation failure is not imminent; however, if the measured value is low relative to the profile value, then the circuit will determine that failure of the starter motor 226, due to the deterioration of the insulation, is imminent.

Figure 3B:
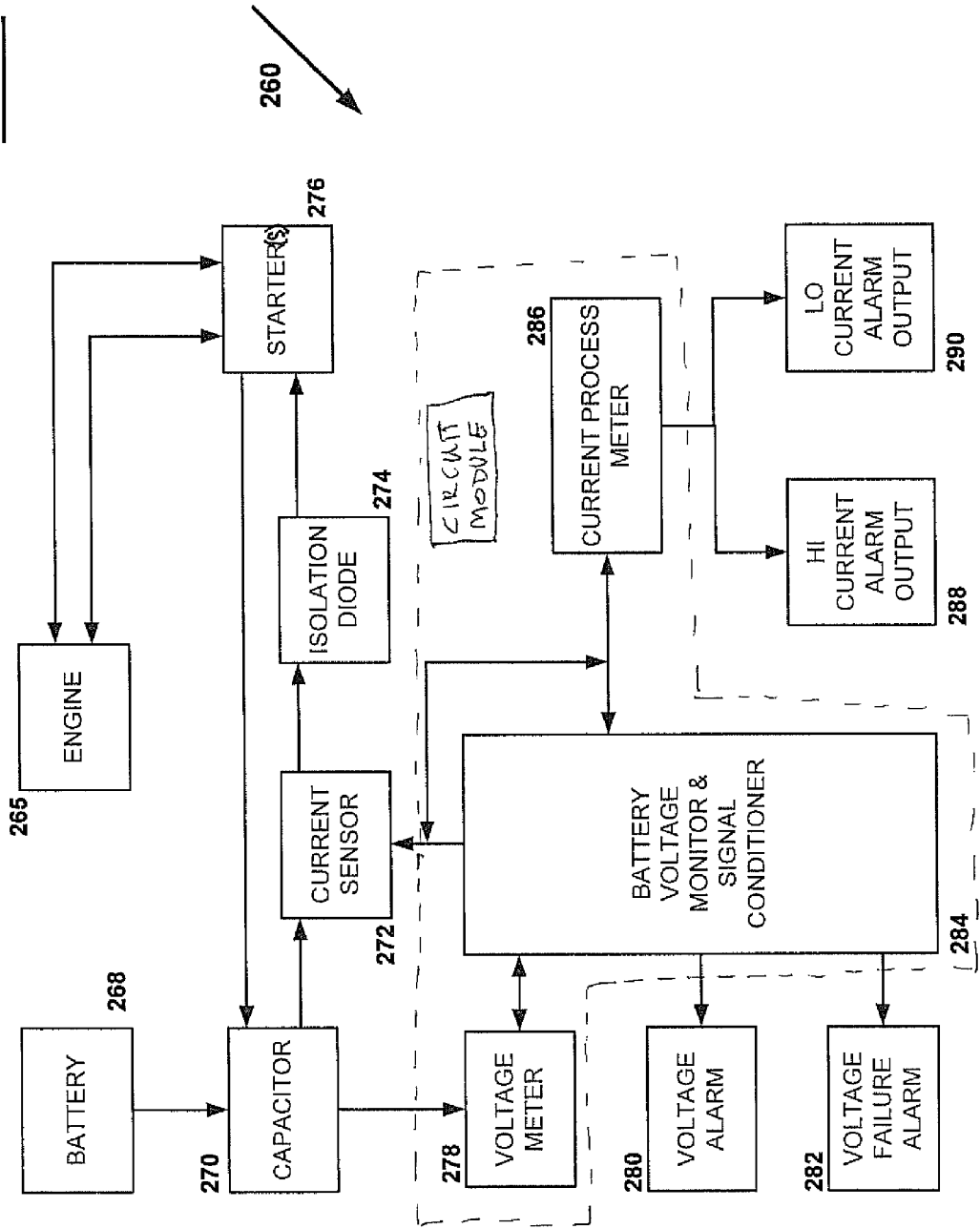
FIG. 3B is a block diagram of the system of the present invention utilizing a battery and a super capacitor as the power source.

FIG. 3B shows an alternative embodiment of the present invention in a block diagram of the system 260 utilizing a battery 268 and a capacitor 270 as the power source. The system 260, defined herein, resides in an enclosure of a type that is available from McMaster-Carr Supply Company of Elmhurst, Ill.). The method and system described herein can be applied to a dual starter system (contemplated hereby) as well, by doubling up the components required and identified herein.

The capacitor 270 can be of a type as disclosed in U.S. Pat. Nos. 5,986,876 for a Double Layer Capacitor, issued to Stepanov et al.; 6,181,546 for Double Layer Capacitor, issued to Stepanov et al.; and, 6,222,723 for an Assymmetric Electrochemical Capacitor And Method Of Making, issued to Razoumov et al. The entire contents of each of which is incorporated herein by reference.

In a single starter system, a suitably rated diode 274, capable of carrying the required cranking current amperage with a minimum voltage drop, is connected in series to the starter 276. The diode 274 will electrically isolate the starter battery 268 and super capacitor 270. The diode 274 value is such that if the battery 268 and super capacitor 270 develop an internal fault, a redundant battery 268 and super capacitor 270 will not be drained while trying to start the engine 265. Additionally, diode isolators 274, with associated heat sinks (such as the power semiconductor heat sinks available from Wakefield Thermal Solutions, Inc. of Pelham, N.H.), can be easily incorporated into the present system 260.

The voltage coming off the battery 268 and capacitor 270 is run through voltage meter 278 to measure the voltage across the circuit. In turn, a battery voltage monitor and signal conditioner 284 interfaces with the voltage meter 278 (exemplary meters are commercially available from Newport Electronics, Inc. of Santa Ana, Calif.).

For the basic system to work, it is necessary to incorporate a current sensing time delay and signal conditioning circuit as an interface between the current sensor (shunt or Hall Effect device) and the starter current meter relay which will detect an over or under current condition. This is needed to buffer the input to the meter relay from high initial starter amperage inrush current which would provide a "false" alarm output.

This circuit can be combined with a battery 268 and capacitor 270 voltage "sample and hold" monitoring device. The voltage monitoring of charging voltage, with a digital display and alarm 280 can be used to assure that the battery 268 and capacitor 270 is getting proper "float" charging voltage applied. This is necessary to assure that the battery 268 and capacitor 270 will be in a state of full charge when called upon and that the battery 268 is in good condition.

The second voltage monitor circuit looks at the voltage low point to which the battery 268 and capacitor 270 dips when the engine 265 is cranked. There are industry accepted criteria (e.g., SAE, EGSA) that have established at what level this voltage dip point indicates an "unhealthy" battery, or capacitor, or both. This added circuit will alarm under an excessive sensed DC voltage dip on a given cranking engine 265 start cycle.

The battery voltage monitor and signal conditioner 284 outputs a voltage alarm 280 in the event that the circuit voltage drops outside acceptable parameters, and outputs a voltage failure alarm 282 in the event that voltage fails.

The battery voltage monitor and signal conditioner 284 interfaces with a current sensor 272 which in turn is in the current stream coming off the battery 268 and capacitor 270. The current sensor 272 allows the current to continue to the isolation diode 274 before the current is utilized by the starter 276.

As with FIG. 3A hereinabove, in a further embodiment of the present invention, a circuit module (not shown) can be interoperably connected to the starter motor 276 for applying a test voltage for determining the possibility of the starter motor 276 failure due to deterioration of the electrical insulation of the starter motor 276 windings. Such circuits are commercially known; a representative module embodying such a circuit is commercially available from Automeg, Inc. of Astatula, Fla. and is available as a 12 pin plug-in module in various configurations. The circuit diagram and module design are disclosed on the Automeg website (www.automeg.com) and are incorporated herein in their entirety.

The circuit module further comprises application means for applying a DC test voltage within the range of 50-500 VDC to the starter motor windings. Typically, a new motor will meet very high resistance of the windings to ground (generally in the range of 100 meg ohms). If the measured ohmic resistance is down in the range of 1 meg ohm, or less, then the motor may be on the verge of failure. Additionally, the circuit provides measuring means for measuring the ohmic resistance of the starter motor 276 windings to determine a measured value; the measured values are compared with a pre-established profile value of the starter motor to determine a compared value. If the measured value is proximate to the profile value, then failure of the starter motor due to insulation failure is not imminent; however, if the measured value is low relative to the profile value, then the circuit will determine that failure of the starter motor 276, due to the deterioration of the insulation, is imminent.

Figure 4:
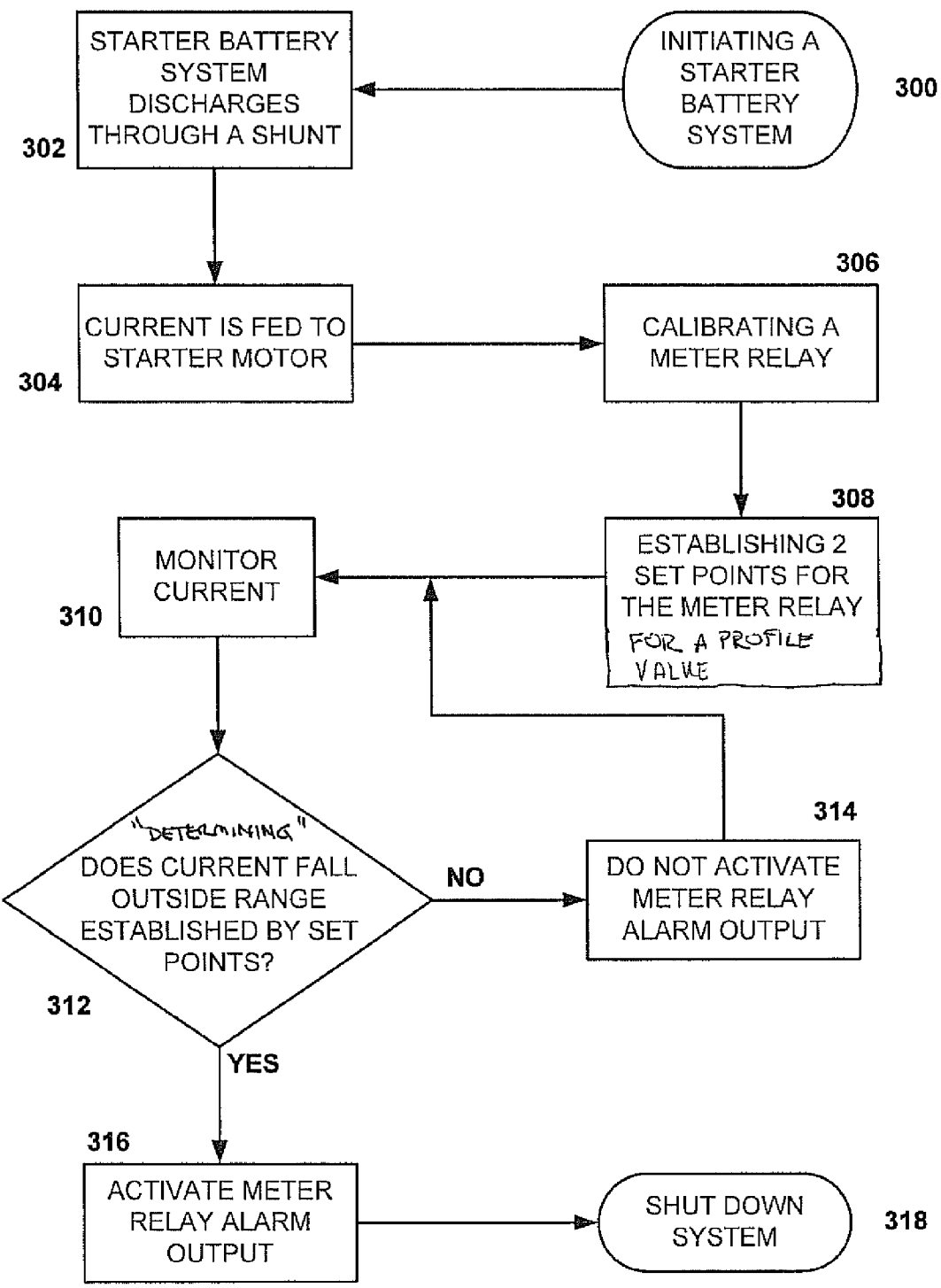
FIG. 4 is a flowchart of the method of the present invention.

Further, in a reciprocal relationship with the battery voltage monitor and signal conditioner 284 is a current process meter 286. The current process meter 286 evaluates the current passing therethrough and activates a high current alarm output 288 if the current is above the applicable set point, or activates a low current alarm output 290 if the current is below the applicable set point FIG. 4 is a flowchart of the method of the present invention. The method begins with the initiation of the starter battery system at step 300. From step 300, the method advances to step 302 where the closing of the starter battery switch causes the starter battery system to discharge through a shunt.

The shunt can be a precision resistor with a pre-calibrated voltage drop in millivolts proportional to a current passing through it. Additionally, the shunt is rated up to, and including, 2000 amperes DC at 100 millivolts. At 1000 amperes DC passing through the shunt, the shunt will cause a voltage drop across the shunt of approximately 50 millivolts. The voltage drop across the shunt relative to the amperes DC passing through it establishes a proportion, wherein the proportion is maintained by any amperage at 2000 amperes DC or below.

Discharge through the shunt (such as those commercially available from PC&S of Stanhope, N.J.) causes the method to advance to step 304 where the current is then fed to the starter motor.

A meter relay is calibrated at step 306 and two set points are established at step 308 for the meter relay. The current going to the starter motor is monitored at step 310. From step 310, the method flow advances to step 312 where the system queries as to whether or not the current being monitored falls outside the range established by the set points. If the response to the query is "NO", then the flow advances to step 314 where the meter relay alarm is maintained in the inactive position while the flow continually re-enters the method flow at step 310. However, if the response to the query at step 312 is "YES", then the method flow advances to step 316.

At step 316, the meter relay alarm output causes a signal device to activate so as to indicate that the current is not within the established set points. In turn, the alarm/signal activation will cause the starter battery system to shut down at step 318. The meter relay alarm output is a dry contact which activates the signal device, which can be: a bell; a set of one or more lighting devices; a digital signal in a communication protocol for interfacing with a monitoring system; or, an Ethernet connection for transmitting the signal via a wireless communication system.

As another alternative embodiment of the present invention it will be recognized that any aspect of the above-noted embodiments may be additionally enhanced when used in combination with additional technological sensing systems (including their own related support systems, electrical connections, etc). For example, it is know that miniaturized infrared (IR) sensors, which can generate a temperature signature signal indicator and can be integrated into a computerized control system (like that proposed for the present invention) such that both a current monitoring and an additional monitoring system (here the IR monitoring system) may be used as parallel monitoring systems. Similarly, it will be recognized by those of skill in the relevant arts that an additional functional parameters may be sensed and monitored. These include, but are not limited to, vibration or harmonic sensing, acoustical sensing, and vibratory sensing.

In view of the above disclosure, those of skill in the related arts will recognize that the proposed system maybe provided optionally as a portable hand-held sensing, monitoring, or testing unit or as a non-hand-held integrated unit that is fully incorporated into a power supply system in a non-portable way. In any of the optional and adaptive embodiments (portable/non-portable) the same features may be provided, and the systems provided by the FIGs. herein may be pursued without escaping from the scope and spirit of the present invention.

In the claims, means or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

For purposes of recognizing adaptability of the claims it will be recognized that the shunt noted in the claims may alternatively be understood to operate as the Hall Effect device and associated alarm and monitoring circuit, without departing from the scope and spirit of the present invention.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A method for monitoring the continuous flow of power delivered by at least one DC direct current starter motor comprising the steps of:
   (a) calibrating a meter relay operably interlinked with a starter battery system and an associated starter control switch;
   (b) establishing two set points for said meter relay;
   (c) closing said starter battery system and said associated starter control switch causing said starter battery system to discharge through a shunt whereby current is fed into said starter motor;
      (i) if said current falls outside a range established by said two set points, then activating a meter relay alarm output; and,
      (ii) if said current remains within said range, then said meter relay alarm output is not activated;
   (d) interoperably connecting a circuit module, to said starter motor, for applying a test voltage, said test voltage operable effective for determining the possibility of said starter motor's failure due to deterioration of the electrical insulation of said starter motor's windings:
   (e) wherein said interoperably connecting step further comprises the steps of;
      (1) applying a DC test voltage within the range of 50-500 VDC to said starter motor windings:
      (2) measuring the ohmic resistance of said starter motor windings to determine a measured value;
      (3) comparing said measured resistance value with a determined profile value to determine a compared value; and
         (I) if said measured value is proximate to said profile value, then determining that failure of said starter motor due to said insulation is not imminent; and
         (II) if said measured value is low relative to said profile value. then determining that failure of said starter motor due to said insulation is imminent.

2. The monitoring method of claim 1, wherein said shunt is a precision resistor with a pre-calibrated voltage drop in millivolts DC proportional to a current passing through it.

3. The monitoring method of claim 2, wherein said shunt is rated up to, and including, 2000 amperes DC at 100 millivolts.

4. The monitoring method of claim 2, wherein at 1000 amperes DC passing through said shunt, said shunt will cause a voltage drop across said shunt of approximately 50 millivolts.

5. The monitoring method of claim 4, wherein said voltage drop across said shunt relative to amperes DC passing through said shunt establishes a proportion, and wherein said proportion is maintained for any amperage at 2000 amperes DC or below.

6. The monitoring method of claim 1, wherein said meter relay alarm output is a dry contact which activates a signal device.

7. The monitoring method of claim 6, wherein said signal device is selected from the group comprising:
   (a) a bell;
   (b) a set of one or more lighting devices;
   (c) a digital signal in a communication protocol for interfacing with a monitoring system; and
   (d) an Ethernet connection for transmitting said signal via a wireless communication system.

8. A system for monitoring the continuous flow of power delivered by at least one multiple starter motor comprising:
   (a) a starter battery system having a starter battery control switch;
   (b) an interoperably connected shunt through which said starter battery system is discharged;
   (c) an interoperably connected voltage monitor and signal conditioner;
   (d) an interoperably connected starter motor into which a current is fed by said discharge;
   (e) an operably connected meter relay, and wherein said meter relay further comprises two set points; and,
   (f) an interoperably connected meter relay alarm output, wherein:
      (i) if said current falls outside a range established by said two set points, then activating said meter relay alarm output; and,
      (ii) if said current remains within said range, then said meter relay alarm output is not activated;
   (g) a circuit module, interoperably connected to said starter motor, for applying a test voltage, effective for determining the possibility of said starter motor's failure due to deterioration of the electrical insulation of said starter motor's windings;
   (h) wherein said circuit module further comprises:
      (I) application means for applying a DC test voltage within the range of 50-500 VDC to said starter motor windings:
      (II) measuring means for measuring the ohmic resistance of said starter motor windings to determine a measured value;

(II) comparing means for comparing said measured resistance value with a profile value to determine a compared value; and
(1) if said measured value is proximate to said profile value, then determining that failure of said starter motor due to said insulation is not imminent; and
(2) if said measured value is low relative to said profile value., then determining that failure of said starter motor due to said insulation is imminent.

9. The monitoring system of claim 8 wherein said shunt is a precision resistor with a pre-calibrated voltage drop in millivolts DC proportional to a current passing through it.

10. The monitoring system of claim 8, wherein said shunt is rated for up to, and including, 2000 amperes DC at 100 millivolts.

11. The monitoring system of claim 8, wherein at 1000 amperes DC passing through said shunt, said shunt will cause a voltage drop across said shunt of approximately 50 millivolts.

12. The monitoring system of claim 11, wherein said voltage drop across said shunt relative to amperes DC passing through said shunt establishes a proportion, and wherein said proportion is maintained for any amperage at 2000 amperes DC or below.

13. The monitoring system of claim 8, wherein said meter relay alarm output is a dry contact which activates a signal device.

14. The monitoring system of claim of claim 13, wherein said signal device is selected from the group comprising:
(i) a bell;
(j) a set of one or more lighting devices;
(k) a digital signal in a communication protocol for interfacing with a monitoring system; and
(l) an Ethernet connection for transmitting said signal via a wireless communication system.

15. A method for monitoring the continuous flow of power delivered by at least one DC direct current starter motor, comprising the steps of:
(a) closing a starter battery system and an associated starter control switch causing said starter battery system to discharge through a shunt whereby current is fed into a starter motor;
(b) directing DC current flow through a Hall Effect having a wire cable throughput;
(c) inducing a current signal from said wire cable throughput wherein said current signal can be read by a control and alarm circuit;
(d) calibrating said control and alarm circuit;
(e) establishing two set points for said control and alarm circuit; and,
(i) if said current falls outside a range established by said two set points, then activating a meter relay alarm output;
(ii) if said current remains within said range, then said meter relay alarm output is not activated; and
establishing a hysteresis at said control and alarm circuit upon the starting of an engine wherein said control and alarm circuit will ignore for a period of time a high current surge as said starter motor begins to turn.

16. The monitoring method of claim 15, further comprising the steps of:
(a) self-calibrating by said control and alarm circuit wherein said control and alarm circuit takes a steady state current as said starter motor is turning over said engine and establishes said steady state current as a baseline current; and (b) utilizing said set points to establish said range to be applied to said baseline current.

17. The monitoring method of claim 15, wherein said Hall Effect Device is a device which provides a signal output proportional to the current flow through a DC direct current feeder cable passed through its center.

18. The monitoring method of claim 17, wherein said Hall Effect Device is rated up to, and including, 2000 amperes DC and produces an output current proportional electrical signal.

19. The monitoring method of claim 17, wherein at 1000 amperes DC passing through said Hall Effect Device, said device will cause a produce an output electrical signal approximately half the amplitude of the signal it would produce if the feeder cable were carrying 2000 amperes DC.

20. The monitoring method of claim 19, wherein said Hall Effect Device produces an electrical signal output proportional to DC current, and wherein said proportion is maintained for any amperage at 2000 amperes DC or below.

21. The monitoring method of claim 15, wherein said current sensor alarm circuit output is a dry contact which activates a signal device.

22. The monitoring system of claim of claim 21, wherein said signal device is selected from the group comprising:
(a) a bell;
(b) a set of one or more lighting devices;
(c) a digital signal in a communication protocol for interfacing with a monitoring system; and
(d) an Ethernet connection for transmitting said signal via a wireless communication system.

23. A system for monitoring the continuous flow of power delivered by at least one DC direct current starter motor each comprising:
(a) a starter battery system having a starter battery control switch;
(b) a Hall Effect Device through which said starter battery system is discharged;
(c) a starter motor into which a current is fed by said discharge;
(d) a current alarm circuit further comprising:
(i) a control and alarm circuit, wherein said control and alarm circuit is capable of establishing a current baseline; and
(ii) self calibrating around said current baseline two set points (one high and one low); and
(e) a relay alarm output, wherein
(i) if said current falls outside a range established by said two set points on said current baseline, then activating said meter current alarm output; and,
(ii) if said current remains within said range, then said current alarm relay output is not activated; and
wherein said control and alarm circuit is capable of establishing a hysteresis upon the starting of an engine wherein said control and alarm circuit will ignore for a period of time a high current surge as said starter motor beings to turn to drive said engine.

24. The monitoring system of claim 23, wherein said control and alarm circuit is capable of taking a steady state current as said starter motor is turning over said engine and establishing said steady state current as a baseline current; and, utilizing said set points to establish said range to be applied to said baseline current.

25. The monitoring system of claim 23 wherein said Hall Effect device is providing an electrical output signal proportional to a current passing through a DC direct current feeder cable passing through the opening in the Hall Effect Device.

26. The monitoring system of claim 25, wherein said Hall Effect Device is rated for up to, and including, 2000 amperes.

27. The monitoring system of claim 25, wherein at 1000 amperes DC passing through said Hall Effect Device, said device will cause an output signal proportional in amplitude and approximately half of the amplitude at 1000 A DC as is obtained at 2000 A DC current flow in the starter motor feeder cable passing through the opening in the Hall Effect Device.

28. The monitoring system of claim 27, wherein said Hall Effect Device output signal proportional to amperes DC passing through said device via the starter motor feeder cable, establishes a proportion, and wherein said proportion is maintained for any amperage at 2000 amperes DC or below.

29. The monitoring system of claim 23, wherein said current alarm circuit output alarm is a dry contact which activates a signal device.

30. The monitoring system of claim of claim 29, wherein said signal device is selected from the group comprising:
  (m) a bell;
  (n) a set of one or more lighting devices;
  (o) a digital signal in a communication protocol for interfacing with a monitoring system; and
  (p) an Ethernet connection for transmitting said signal via a wireless communication system.

* * * * *